(12) United States Patent
Nakamura et al.

(10) Patent No.: US 10,368,470 B2
(45) Date of Patent: Jul. 30, 2019

(54) REACTOR UNIT AND FUEL CELL VEHICLE INCLUDING REACTOR UNIT

(71) Applicant: TOYOTA JIDOSHA KABUSHIKI KAISHA, Toyota-shi, Aichi-ken (JP)

(72) Inventors: Ikuhiro Nakamura, Nisshin (JP); Shuji Kawamura, Toyota (JP); Kozo Matsuura, Toyota (JP); Koji Katano, Toyota (JP); Hiroyuki Sekine, Nisshin (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 129 days.

(21) Appl. No.: 15/437,788

(22) Filed: Feb. 21, 2017

(65) Prior Publication Data

US 2017/0251575 A1    Aug. 31, 2017

(30) Foreign Application Priority Data

Feb. 25, 2016    (JP) .................................. 2016-033972

(51) Int. Cl.
*B60K 1/00*    (2006.01)
*B60K 1/04*    (2019.01)
(Continued)

(52) U.S. Cl.
CPC .......... *H05K 7/20845* (2013.01); *B60K 1/00* (2013.01); *B60K 1/04* (2013.01); *B60K 11/02* (2013.01); *B60L 50/72* (2019.02); *B60L 58/33* (2019.02); *H01F 27/08* (2013.01); *H01F 27/10* (2013.01); *H01M 8/04029* (2013.01); *H01M 8/04201* (2013.01); *H02M 3/155* (2013.01); *B60K 2001/001* (2013.01); *B60K 2001/003* (2013.01);
(Continued)

(58) Field of Classification Search
None
See application file for complete search history.

(56) References Cited

U.S. PATENT DOCUMENTS

| 2009/0206662 A1 | 8/2009 | Kakuda et al. |
| 2010/0315780 A1 | 12/2010 | Murakami |

(Continued)

FOREIGN PATENT DOCUMENTS

| CN | 102422413 A | 4/2012 |
| JP | 2009-189149 | 8/2009 |

(Continued)

*Primary Examiner* — Daniel S Gatewood
(74) *Attorney, Agent, or Firm* — Finnegan, Henderson, Farabow, Garrett & Dunner, LLP

(57) ABSTRACT

A reactor unit includes reactors; and a cooler. The reactors are disposed in at least one line on a reactor cooling surface that is one of outer surfaces of the cooler. The cooler has a cooling medium flow passage that is in contact with an inner surface on a reverse side of the reactor cooling surface. The cooling medium flows linearly from an inlet portion to an outlet portion of the cooling medium flow passage. A direction in which the cooling medium flows inside the cooling medium flow passage is same as a direction in which the reactors are disposed in the at least one line. Cooling fins are provided on the inner surface on the reverse side of the reactor cooling surface. A longitudinal direction of each cooling fin is same as the direction in which the cooling medium flows inside the cooling medium flow passage.

3 Claims, 8 Drawing Sheets

(51) Int. Cl.
  *H05K 7/20* (2006.01)
  *B60K 11/02* (2006.01)
  *B60L 50/72* (2019.01)
  *B60L 58/33* (2019.01)
  *H01F 27/08* (2006.01)
  *H01F 27/10* (2006.01)
  *H01F 37/00* (2006.01)
  *H02M 3/155* (2006.01)
  *H01M 8/04029* (2016.01)
  *H01M 8/04082* (2016.01)
  *H01M 8/04* (2016.01)
  *H02M 3/15* (2006.01)

(52) U.S. Cl.
  CPC ..... *B60K 2001/005* (2013.01); *B60L 2210/10* (2013.01); *B60Y 2400/202* (2013.01); *B60Y 2400/61* (2013.01); *H01F 37/00* (2013.01); *H01M 2250/20* (2013.01); *Y02T 90/32* (2013.01); *Y02T 90/34* (2013.01)

(56) References Cited

U.S. PATENT DOCUMENTS

| | | | |
|---|---|---|---|
| 2012/0014066 A1* | 1/2012 | Morino | H01L 23/473 361/707 |
| 2012/0247743 A1 | 10/2012 | Niimi et al. | |
| 2013/0206371 A1 | 8/2013 | Fujita | |

FOREIGN PATENT DOCUMENTS

| | | | |
|---|---|---|---|
| JP | 2009-195060 A | | 8/2009 |
| JP | 2012-216711 A | | 11/2012 |
| JP | 2013-244759 | | 12/2013 |
| JP | 2015-023613 A | | 2/2015 |
| JP | 2015023613 A | * | 2/2015 |
| WO | WO2010/131317 A1 | | 11/2010 |
| WO | WO2012/056880 A1 | | 5/2012 |

* cited by examiner

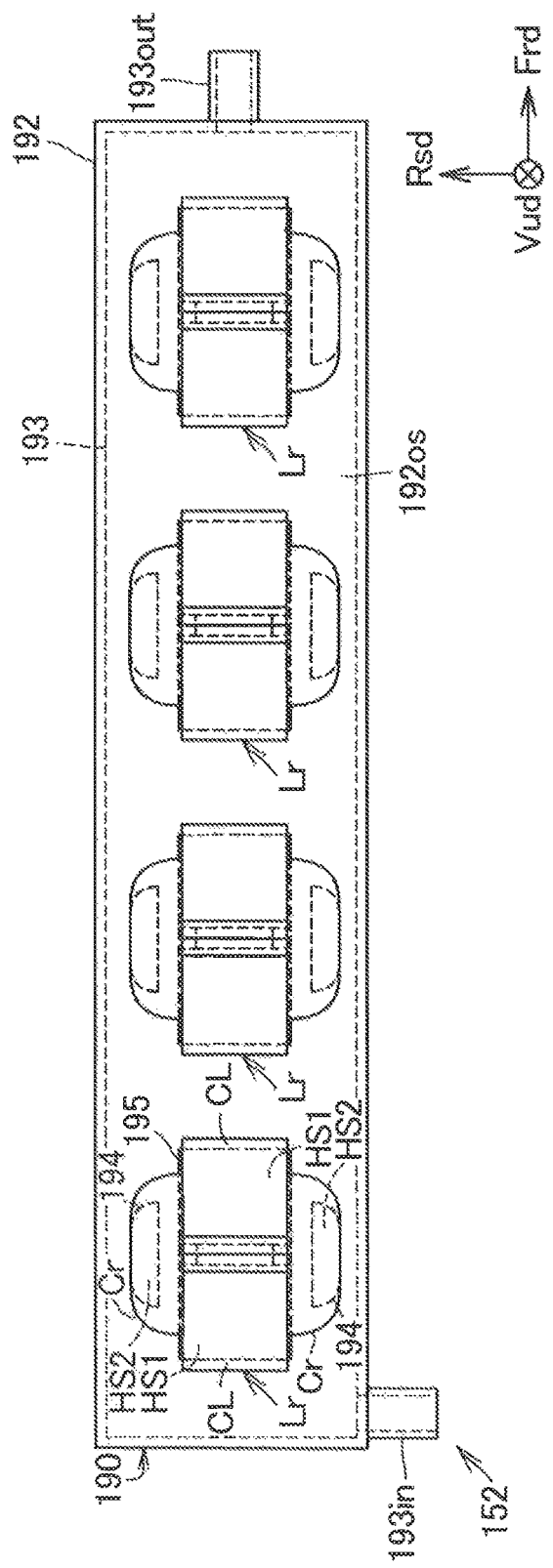

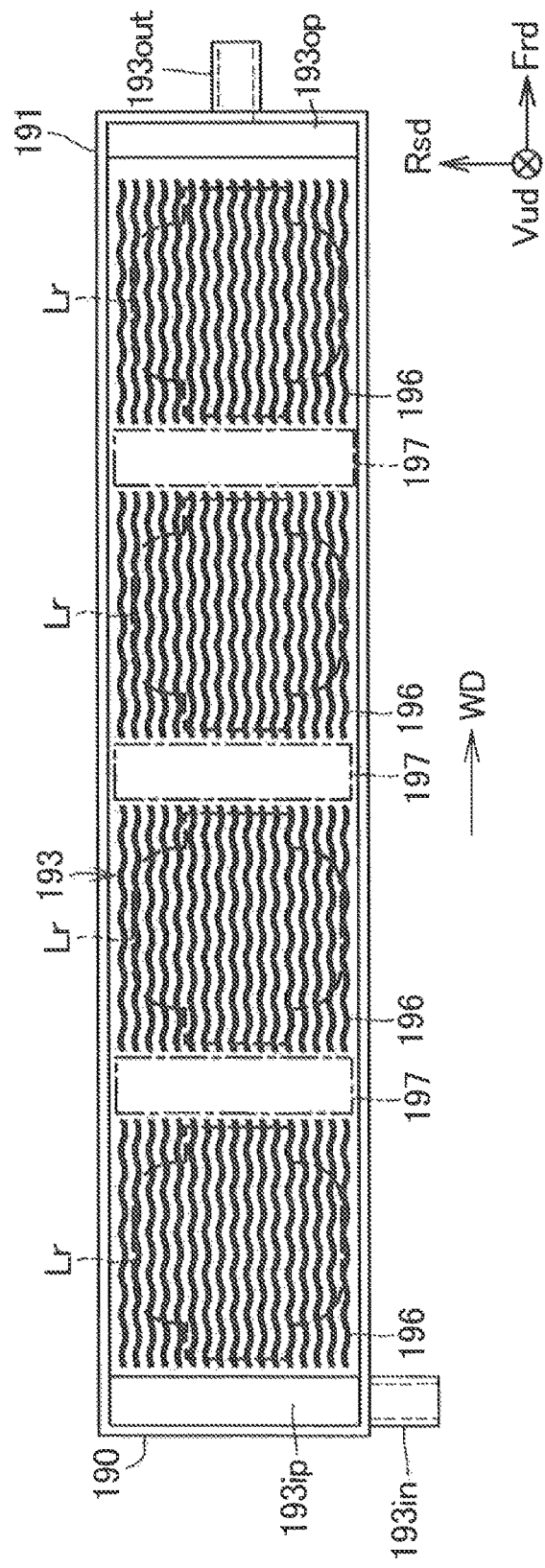

FIG. 5

| KIND | LINEAR FLOW PASSAGE | PARALLEL FLOW PASSAGE | TURNING FLOW PASSAGE |
|---|---|---|---|
| FLOW PASSAGE SECTIONAL AREA S | Sa | 4Sa | Sa/2 |
| FLOW PASSAGE LENGTH L | La | La/4 | 2La |
| HEAT TRANSFER COEFFICIENT h ($\propto [1/S]^{2/5}$) | ○ | × | ◎ |
| PRESSURE LOSS $\Delta P$ ($\propto [1/S]^2 \cdot L$) | ○ | ◎ | × |

↑ OPTIMAL

REACTOR UNIT AND FUEL CELL VEHICLE INCLUDING REACTOR UNIT

INCORPORATION BY REFERENCE

The disclosure of Japanese Patent Application No. 2016-033972 filed on Feb. 25, 2016 including the specification, drawings and abstract is incorporated herein by reference in its entirety.

BACKGROUND

1. Technical Field

The disclosure relates to a reactor unit and a fuel cell vehicle including the reactor unit.

2. Description of Related Art

Japanese Patent Application Publication No. 2013-244759 (JP 2013-244759 A) describes that a converter including a reactor portion (also referred to as a "reactor unit") is used as a DC-DC converter that converts output voltage of a fuel cell in a fuel cell system mounted in a fuel cell vehicle. The reactor unit includes a plurality of reactors, and the plurality of reactors are disposed on two levels, which are upper and lower levels. On each of the levels, the plurality of reactors are disposed in a line in the front-rear direction of the fuel cell vehicle.

SUMMARY

However, when the above-mentioned reactor unit is provided, a space for arranging the reactor unit and a device structure including the reactor unit may be insufficient in the height direction depending on a mounting position of the reactor unit. Further, when temperature of the reactors increases excessively due to heat generated in the reactors, output performance of the converter is deteriorated. Therefore, it is desired to ensure sufficient cooling performance for the reactors.

As stated above, it is desired to ensure sufficient cooling performance of a reactor unit including a plurality of reactors, and to save space in a height direction of the reactor unit and a device structure including the reactor unit.

A first aspect of the disclosure relates to a reactor unit including a plurality of reactors; and a cooler configured such that a cooling medium flows in an inside of the cooler and the plurality of reactors are disposed on an outside of the cooler to cool the plurality of reactors. The plurality of reactors are disposed in at least one line on a reactor cooling surface that is one of outer surfaces of the cooler. The cooler has a cooling medium flow passage that is in contact with an inner surface on a reverse side of the reactor cooling surface. The cooling medium flows linearly from an inlet portion to an outlet portion of the cooling medium flow passage. A direction in which the cooling medium flows inside the cooling medium flow passage is same as a direction in which the plurality of reactors are disposed in the at least one line. Cooling fins are provided on the inner surface on the reverse side of the reactor cooling surface. A longitudinal direction of each of the cooling fins is same as the direction in which the cooling medium flows inside the cooling medium flow passage. In the reactor unit according to the first aspect, since the plurality of reactors are disposed on the reactor cooling surface, which is one of outer surfaces of the cooler, it is possible to reduce height of the reactor unit. Also, the cooling medium flows linearly from the inlet portion to the outlet portion of the cooling medium flow passage, and the direction in which the cooling medium flows inside the cooling medium flow passage is the same as the direction in which the plurality of reactors are disposed in the at least one line. Therefore, it is possible to achieve both reduction of pressure loss in the cooling medium flow passage and improvement of the heat transfer coefficient, thereby ensuring sufficient cooling performance.

In the reactor unit according to the above-described aspect, in the cooling medium flow passage of the cooler, any one of i) a flat flow passage portion in which no cooling fin is provided and the inner surface is a flat surface, ii) a curved surface flow passage portion in which no cooling fin is provided and the inner surface is a curved surface, iii) a low fin flow passage portion including low cooling fins having a height lower than a height of the cooling fins, and iv) a small number fin flow passage portion in which the number of the cooling fins is smaller than the number of the cooling fins at a position corresponding to each of the plurality of reactors, may be provided at a position corresponding to a gap between the reactors adjacent to each other in the direction in which the plurality of reactors are disposed in the at least one line. With this configuration, turbulence is increased in the cooling medium flow in the cooling medium flow passage at the position corresponding to the gap between the reactors adjacent to each other. Thus, it is possible to prevent deterioration of cooling performance caused by a reduction in the heat transfer coefficient of the cooler due to a temperature boundary layer formed near a wall surface of the cooling medium flow passage.

A second aspect of the disclosure relates to a fuel cell vehicle including a fuel cell; the reactor unit according to the first aspect; and a DC-DC converter that converts output voltage of the fuel cell. The fuel cell is disposed in a front compartment of the fuel cell vehicle, and the reactor unit included in the DC-DC converter is disposed above the fuel cell such that the plurality of reactors are disposed in a lower side and the cooler is disposed in an upper side. In the fuel cell vehicle according to the second aspect, the reactor unit, which has a height lower than that of the conventional reactor unit, is disposed above the fuel cell. Therefore, it is possible to save space in the height direction of a device structure that includes the DC-DC converter including the reactor unit, and the fuel cell. As a result, it is possible to dispose the reactor unit above the fuel cell in the front compartment of the fuel cell vehicle, which has a space restricted in the height direction.

In the fuel cell vehicle according to the second aspect, a drive circuit unit for a cooling medium pump that supplies, to the fuel cell, a fuel cell cooling medium for cooling the fuel cell, and a drive circuit unit for a fuel pump that supplies fuel gas to the fuel cell may be disposed on an outer surface of an upper side of the cooler. With this configuration, the drive circuit unit for the cooling medium pump and the drive circuit unit for the fuel pump are disposed on top of the cooler of the reactor unit, thereby cooling these drive circuit units and saving space.

The disclosure is realized in various forms. For example, the disclosure may be realized in forms of the above-described reactor unit, the above-described fuel cell vehicle, and a fuel cell system.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein:

FIG. 3A and FIG. 3B are explanatory views of a structure of a reactor unit;

FIG. 4A and FIG. 4B are explanatory views of a cooling medium flow passage; and

FIG. 5 is an explanatory view in which heat transfer coefficient and pressure loss are compared among different kinds of cooling medium flow passages.

DETAILED DESCRIPTION OF EMBODIMENTS

Figure 1:
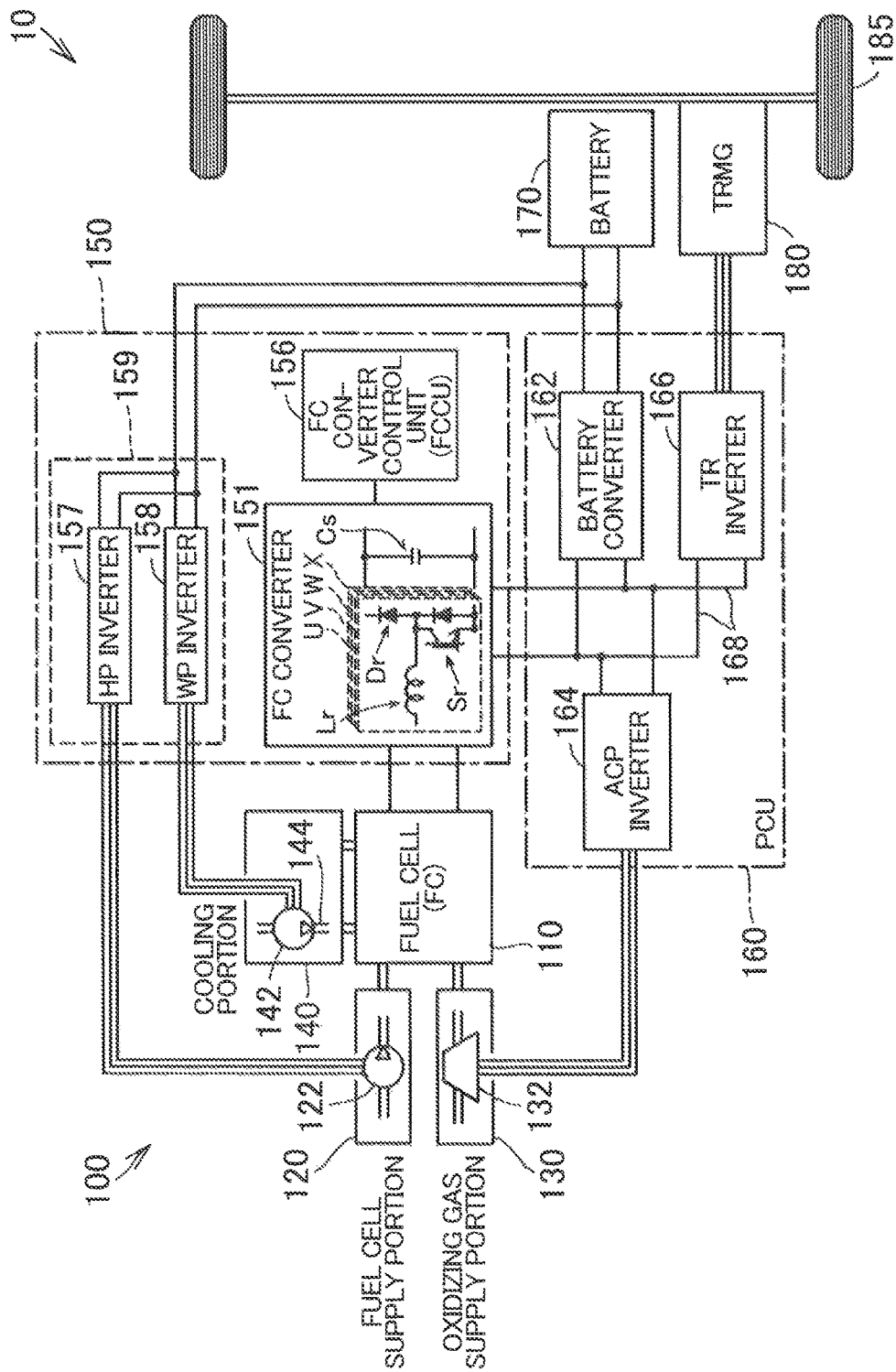
FIG. 1 is a schematic view of a structure of a fuel cell vehicle in which a fuel cell system is mounted in an embodiment of the disclosure.

FIG. 1 is a schematic view of a structure of a fuel cell vehicle 10 in which a fuel cell system 100 is mounted in an embodiment of the disclosure. The fuel cell vehicle 10 includes a fuel cell (also referred to as an "PC") HO, a fuel gas supply portion 120, an oxidizing gas supply portion 130, a cooling portion 140, an FC power supply unit 150, a power control unit 160, a battery 170, a traction motor (also referred to as a "TRMG") 180, and wheels 185. In addition to the above components, the fuel cell vehicle 10 includes various devices included in, for example, in the fuel cell system. The various devices include auxiliary equipment, various sensors, various detectors, relays, and electronic devices. However, in this example, illustration and explanation of them are omitted.

The FC power supply unit 150 includes an FC converter 151, an FC converter control unit 156, and an inverter unit 159. The inverter unit 159 includes an HP inverter 157 and a WP inverter 158. The PC power supply unit 150 is housed in a dedicated case.

The power control unit 160 includes a battery converter 162, an ACP inverter 164, and a TR inverter 166. The power control unit 160 is also housed in a dedicated case.

The fuel cell system 100 includes the fuel cell 110, the fuel gas supply portion 120, the oxidizing gas supply portion 130, the cooling portion 140, the PC power supply unit 150, and the ACP inverter 164. A "converter" herein means a DC-DC converter.

The fuel cell vehicle 10 travels by driving the traction motor 180 using power supplied from at least one of the fuel cell 110 and the battery 170.

In this embodiment, the fuel cell 110 is a polymer electrolyte fuel cell. The fuel cell 110 includes a stack structure in which a plurality of unit cells are stacked in series. Each of the unit cells includes a membrane electrode assembly (MEA). Hydrogen gas is supplied as fuel gas from the fuel gas supply portion 120 to an anode of the fuel cell 110. Air is supplied as oxidizing gas from the oxidizing gas supply portion 130 to a cathode of the fuel cell 110.

The fuel gas supply portion 120 includes a hydrogen tank, various valves, a fuel pump, an injector and so on. The fuel gas supply portion 120 supplies fuel gas to the fuel cell 110. FIG. 1 shows a fuel pump (also referred to as an "HP") 122 among various components of the fuel gas supply portion 120.

The oxidizing gas supply portion 130 includes an air compressor and various valves. The oxidizing gas supply portion 130 supplies oxidizing gas to the fuel cell 110. FIG. 1 shows an air compressor (also referred to as an "ACP") 132 among components of the oxidizing gas supply portion 130.

The cooling portion 140 includes a radiator, a cooling medium pump, a cooling medium circulation passage 144, a temperature sensor and so on. The cooling portion 140 includes a fuel cell cooling system that supplies a cooling medium such as coolant to the fuel cell 110, and a circuit cooling system (not shown) that supplies a cooling medium such as coolant to a later described reactor unit and an intelligent power module (IPM). A cooling medium pump (also referred to as a "WP") 142 is provided in the cooling medium circulation passage 144 of the fuel cell cooling system and circulates the cooling medium that cools the fuel cell.

The FC converter 151 is formed of a multi-phase boost DC-DC converter including a plurality of driving phases (in this example, four phases that are a U phase, a V phase, a W phase, and an X phase) and a smoothing capacitor Cs. Each of the driving phases is formed of a boosting chopper circuit including a reactor Lr, a switching device Sr, and a rectifying diode Dr. The FC converter 151 is connected to the fuel cell 110, and boosts output voltage of the fuel cell 110 by changing a switching cycle duty ratio of the switching device Sr inside the FC converter 151 in accordance with a command from the FC converter control unit 156, and outputs the boosted voltage to high-voltage wiring 168. The reactor Lr in each of the driving phases is included in the reactor unit described later.

The FC converter control unit (also referred to as an "FCCU") 156 switches the number of driving phases in accordance with passing power of a fuel cell output so as to maximize conversion efficiency, and also controls an operation of the FC converter 151 by controlling an switching operation of the switching device of each driving phase to be operated. For example, passing power is divided into four level areas, and the FC converter control unit 156 drives the U phase only in the lowest first passing power area, drives the U phase and the V phase in the second passing power area, drives the U phase, the V phase, and the W phase in the third area, and drives all of the U phase, the V phase, the W phase, and the X phase in the fourth passing power area.

The HP inverter 157 converts direct current power obtained from at least one of the fuel cell 110 and the battery 170 into three-phase alternating current power, and supplies it to the fuel pump (HP) 122 of the fuel gas supply portion 120. The HP inverter 157 may be regarded as a "drive circuit unit" that drives the fuel pump 122.

The WP inverter 158 also converts direct current power obtained from at least one of the fuel cell 110 and the battery 170 into three-phase alternating current power, and supplies it to the cooling medium pump (WP) 142 in the cooling portion 140. The WP inverter 158 may be regarded as a "drive circuit unit" that drives the cooling medium pump 142.

The battery converter 162 is a DC-DC converter that is able to perform bidirectional conversion. The battery converter 162 is also connected to the FC converter 151 through the high-voltage wiring 168. The battery converter 162 adjusts voltage on the high-voltage wiring 168 side or voltage on the battery 170 side to a desired voltage value in accordance with a command from a control portion (not shown).

The battery 170 is a secondary battery that stores electric power energy generated by the fuel cell 110 and is able to repeat charging and discharging. The battery 170 may be, for example, a lithium ion battery. The battery 170 may be a different kind of battery such as a lead storage battery, a nickel-cadmium battery, or a nickel-hydrogen battery.

The ACP inverter 164 converts direct current power obtained from at least one of the fuel cell 110 and the battery 170 into three-phase alternating current power, and supplies it to the air compressor (ACP) 132 of the oxidizing gas supply portion 130.

The TR inverter 166 converts direct current power obtained from at least one of the fuel cell 110 and the battery 170 into three-phase alternating current power and supplies it to the traction motor 180.

The traction motor 180 is a synchronous motor including a three-phase coil. The traction motor 180 is supplied with three-phase alternating current power from the TR inverter 166, and drives the wheels 185. When regenerative power is generated in the traction motor 180 due to rotation of the wheels 185, the regenerative power is converted into direct current power by the TR inverter 166, and the battery 170 is charged with the regenerative power through the battery converter 162.

Figure 2A:
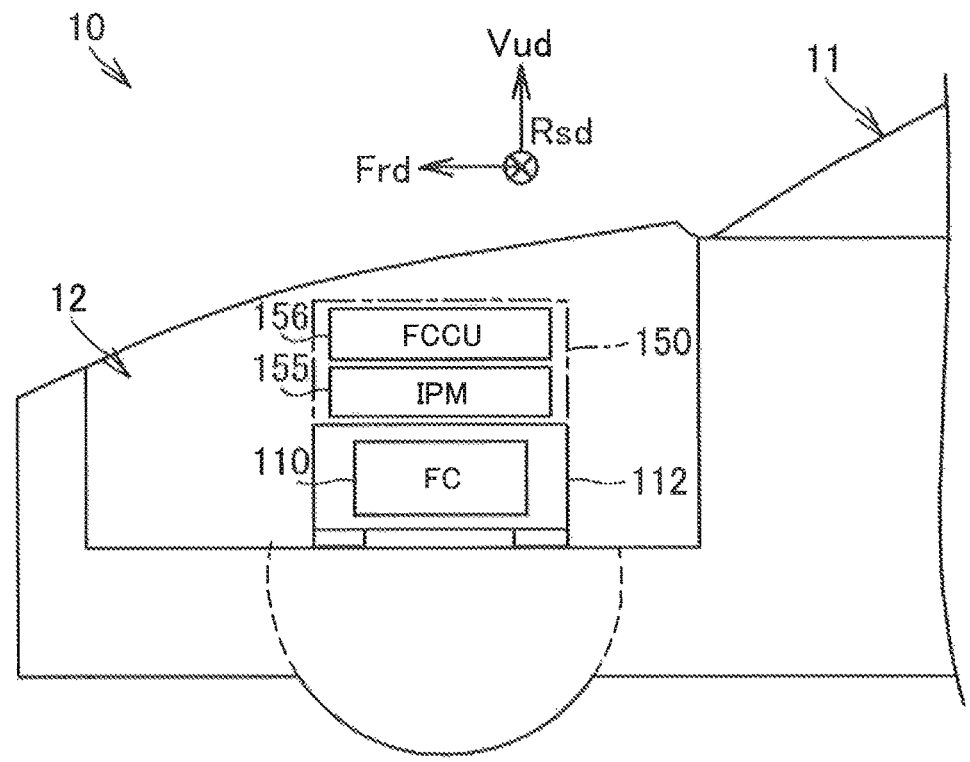
FIG. 2A and FIG. 2B are explanatory views schematically showing components of the fuel cell system mounted in the fuel cell vehicle.
Figure 2B:
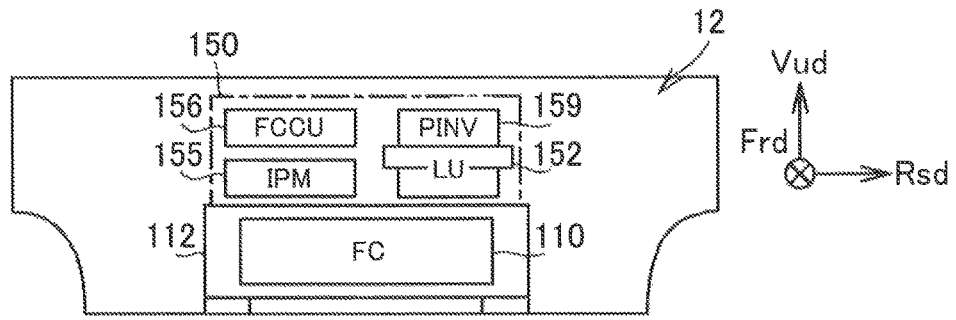

FIG. 2A and FIG. 2B are explanatory views schematically showing components of the fuel cell system 100 (FIG. 1) mounted in the fuel cell vehicle 10. In this example, some components of the fuel cell system 100 are housed in a front compartment 12 located in front of a vehicle cabin 11. FIG. 2A is a side view of the front compartment 12 seen from the left side of the fuel cell vehicle 10, and FIG. 2B is a front view of the front compartment 12 seen from the rear side of the fuel cell vehicle 10. FIG. 2A and FIG. 2B show a forward direction Frd, which is an advancing direction of the fuel cell vehicle 10, a rightward direction Rsd, and an upward direction Vud.

As shown in FIG. 2A and FIG. 2B, an FC assembly 112, in which the fuel cell 110, components in the vicinity of the fuel cell 110 and so on are provided in a dedicated case (not shown), is installed on a floor portion of the front compartment 12. On top of the FC assembly 112, the FC power supply unit 150 is disposed. The FC power supply unit 150 is assembled to and integrated with the FC assembly 112. Also, as shown in FIG. 2B, a reactor unit (LU) 152 is disposed in a right lower portion of an inside of the FC power supply unit 150, and on top of the reactor unit (LU) 152, the inverter unit (PINV) 159 is disposed so as to be in contact with an upper portion of the reactor unit 152. Further, in a left lower portion of an inside of the FC power supply unit 150, a power element module (IBM) 155 is disposed, and on top of the power element module (IPM) 155, the FC converter control unit (KM 156 is disposed. The power element module 155 includes the switching device Sr, the diode Dr, and the smoothing capacitor Cs of each of the driving phases of the FC converter 151 (FIG. 1), and a cooler that cools these devices. Illustration and explanation regarding arrangement of the devices and the cooler included in the power, element module 155 are not required in the explanation of the disclosure and are thus omitted. The cooling medium is also supplied to this cooler through a cooling medium circulation passage of the circuit cooling system (not shown) in the cooling portion 140 (FIG. 1).

Figure 3A:
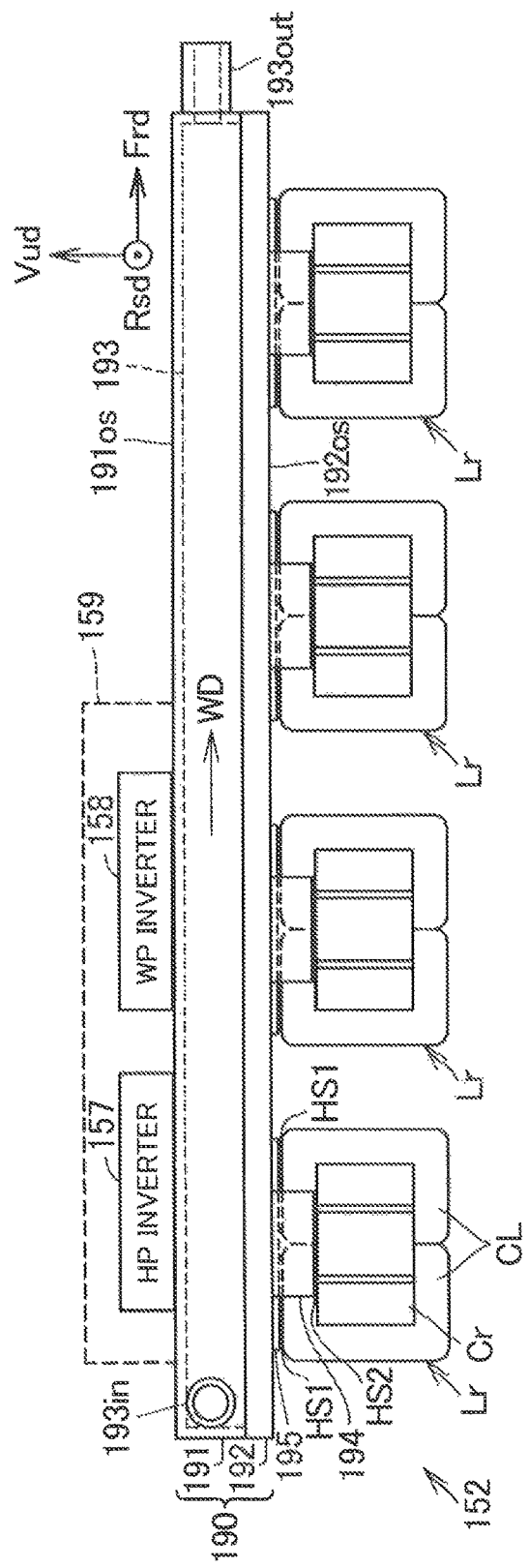

FIG. 3A and FIG. 3B are explanatory views of a structure of the reactor unit 152. FIG. 3A is a right side view of the reactor unit 152, and FIG. 3B is a bottom view of the reactor unit 152. The reactor unit 152 includes the plurality of reactors Lr, and a cooler 190 that cools the plurality of reactors Lr.

In the bottom view in FIG. 3B, the cooler 190 has a reactor cooling surface 192os that is an outer surface, the longitudinal direction of the reactor cooling surface 192os extending along the forward direction Frd, and the short-side direction of the reactor cooling surface 192os extending along the rightward direction Rsd. As shown in FIG. 3A, the cooler 190 also has a flat-shaped substantially rectangular parallelepiped structure that has a small height in the upward direction Vud, and includes a cooling container portion 191 having a box shape in which a lower surface is open, and a flat plate portion 192 that covers the opening.

On a side surface of the cooling container portion 191, a cooling medium inlet 193in is provided, into which the cooling medium flows in the rightward direction Rsd. On a side surface of a distal end side of the cooling container portion 191 in the forward direction Frd, a cooling medium outlet 193out is provided, from which the cooling medium flows out along the forward direction Frd. The internal space of the cooling container portion 191, which is covered by the flat plate portion 192, forms a cooling medium flow passage 193. The cooling medium flow passage 193 is a cooling medium flow passage where the cooling medium, which flows into an inlet portion 193ip from the cooling medium inlet 193in, flows linearly in a flow direction WD towards an outlet portion 193op connected with the cooling medium outlet 193out. The flow direction WD is the same direction as the forward direction Frd.

On the reactor cooling surface 192os, which is the outer surface of the flat plate portion 192, the plurality of reactors Lr are disposed in a line along the flow direction WD. In this example, four reactors Lr are disposed. The reactor Lr includes a core portion Cr, and a coil portion CL wound around the core portion Cr. In each of the reactors Lr, the core portion Cr is mounted on a core portion mounting base 194 through a heat dissipation sheet HS2, and the coil portion CL is mounted on a coil portion mounting base 195 through a heat dissipation sheet HS1. As the heat dissipation sheets HS1, HS2, silicon-based sheets and so on are used. Instead of the heat dissipation sheets HS1, HS2, a silicon-based potting (resin potting) may be used. The core portion Cr and the coil portion CL of the reactor Lr are covered and protected by a resin housing (not shown). Heat generated in the reactors Lr disposed on the reactor cooling surface 192os of the flat plate portion 192 is dissipated through the heat dissipation sheets HS1, HS2 and the flat plate portion 192 to the cooling medium flowing in the cooling medium flow passage 193.

As explained earlier, operations of the plurality of driving phases (the phase, the V phase, the W phase and the X phase) of the FC converter 151 (FIG. 1) are controlled in accordance with passing power. As the passing power increases, the number of driving phases to be operated is incremented in the order of the U phase, the V phase, the W phase, and the X phase. Therefore, it is preferred that the four reactors Lr of the reactor unit 152 should be arrayed in the order of the U phase, the V phase, the W phase, and the X phase along the flow direction WD (forward direction Frd) of the cooling medium. However, the disclosure is not limited to this, and the reactors Lr may be disposed in different orders.

Further, as shown in FIG. 3A, the inverter unit 159, which includes the HP inverter 157 and the WP inverter 158, is disposed on an outer surface 191os on the side opposite to the reactor cooling surface 192os of the flat plate portion 192 of the cooler 190. Thermal grease is applied between the inverter unit 159 and the outer surface 191os. A heat dissipation sheet may also be interposed similarly to the reactor Lr. Heat generated in the inverter unit 159 is dissipated through the outer surface 191os to the cooling medium flowing in the cooling medium flow passage 193. Therefore, the cooler 190 is also able to cool the HP inverter 157 and the WP inverter 158 of the inverter unit 159.

Figure 4B:
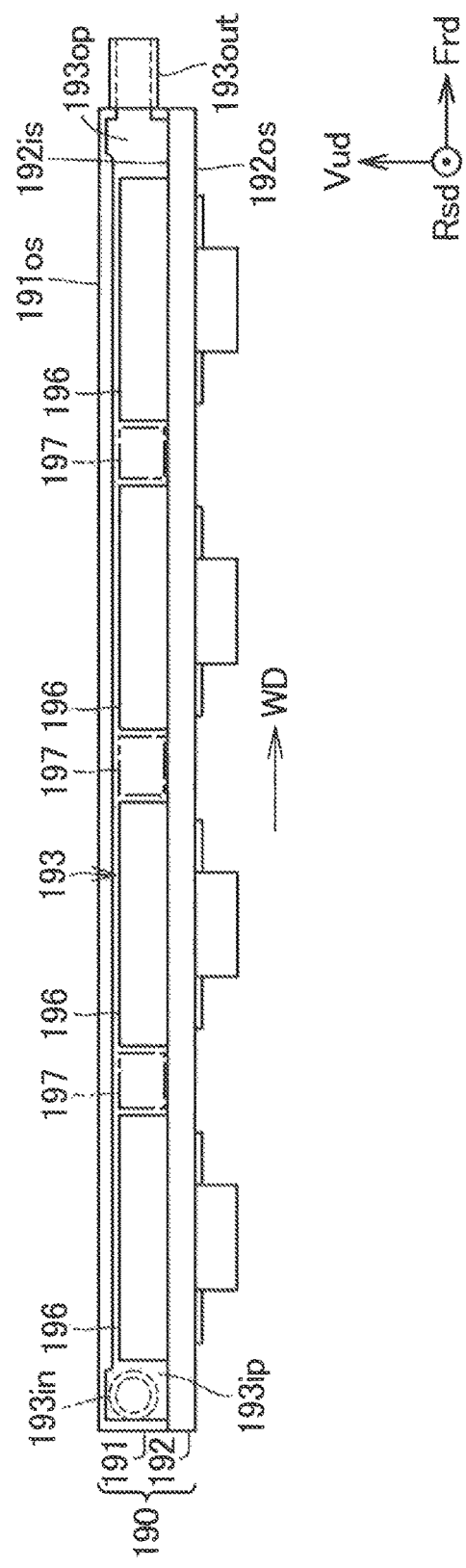

FIG. 4A and FIG. 4B are explanatory views of the cooling medium flow passage 193. FIG. 4A is a bottom view of the cooler 190, FIG. 4A showing the cooling medium flow passage 193 that is seen through the cooler 190. FIG. 4B is a right side view of the cooler 190, FIG. 4B showing the cooling medium flow passage 193 that is seen through the cooler 190, in FIG. 4A, external shapes of the reactors Is are shown by broken lines so as to facilitate understanding of a positional relation between the cooling medium flow passage 193 and the plurality of reactors Lr.

As shown in FIG. 4A and FIG. 4B, a plurality of cooling fins 196 are provided on an inner surface 192*is* on the reverse side of the reactor cooling surface 192*os*. The longitudinal direction of the cooling fins 196 extends along the flow direction WD of the cooling medium. As shown in FIG. 4A, the cooling fins 196 are wavy fins having wavy curved wall surfaces extending along the flow direction WD. Basically, the plurality of cooling fins 196 have wall surfaces extending along the flow direction WD, and it is thus possible to adjust the flow of the cooling medium along the flow direction WD. Further, since each of the cooling fins 196 is a wavy fin, it is possible to improve cooling performance as compared to a straight cooling fin, due to an effect of turbulent flows generated by the wavy fins.

As explained so far, the cooling medium flow passage 193 is a linear flow passage in which the cooling medium flows linearly from the cooling medium inlet 193*in* to the cooling medium outlet 193*out*. The reason why the linear flow passage is used as the cooling medium flow passage 193 is as follows.

FIG. 5 is an explanatory view comparing heat transfer coefficients and pressure losses of various cooling medium flow passages. Three kinds of the cooling medium flow passages are shown, which are a linear flow passage, a parallel flow passage, and a turning flow passage. In the linear flow passage, a direction in which the plurality of (in this example, four) reactors Lr are disposed in a line coincides with a cooling medium flow direction, and thus, the plurality of reactors Lr are cooled in sequence. In the parallel flow passage, the plurality of reactors Lr are cooled in parallel, that is, the plurality of reactors Lr are cooled by the cooling medium that is distributed to the parallel flows corresponding to the plurality of reactors Lr disposed in a line, in the turning flow passage, the plurality of reactors Lr are cooled in sequence by the cooling medium that flows in a first half flow passage and a returning flow passage. The flow direction in the first half flow passage is the same as that of the linear flow passage, and the flow direction in the returning flow passage is opposite to the flow direction of the cooling medium in the first half flow passage.

It is assumed that the flow of the cooling medium in the cooling medium flow passage basically becomes a turbulent flow due to the cooling fins 196, which are wavy fins. At this time, a heat transfer coefficient h between wall surfaces of the inner surface 192*is* and the cooling fins 196, which are in contact with the cooling medium flow passage 193 (hereinafter, these walls are also simply referred to as "wall surfaces of the cooling medium flow passage"), and the cooling medium flowing in the cooling medium flow passage 193 is expressed by an expression (1) below.

$$h \propto Re^{(4/5)} \propto (v \times D_H)^{(4/5)} \tag{1}$$

Here, Re represents Reynolds number, v represents flow velocity of the cooling medium, and $D_H$ represents a hydraulic diameter. That is, the heat transfer coefficient h is proportional to the (4/5)th power of the Reynolds number Re, and the Reynolds number Re is proportional to the flow velocity v, and also proportional to the hydraulic diameter $D_H$. As a result, the heat transfer coefficient h is proportional to the (4/5)th power of the flow velocity v, and also proportional to the (4/5)th power of the hydraulic diameter $D_H$.

The cooling medium flow velocity v is expressed by the following expression (2), and the hydraulic diameter $D_H$ is expressed by the following expression (3).

$$v = W/S \tag{2}$$

$$D_H = k \cdot S^{(1/2)} \tag{3}$$

W represents a flow rate of the cooling medium, S represents a flow passage sectional area, and k represents a conversion factor.

When the cooling medium flow rate W is fixed, the heat transfer coefficient h is expressed by the following expression (4) based on the expression (1) to expression (3) stated above.

$$h \propto (1/S)^{(2/5)} \tag{4}$$

That is, since the heat transfer coefficient h is proportional to the (2/5)th power of a reciprocal number of the flow passage sectional area S. Thus, as the flow passage sectional area S becomes larger, the heat transfer coefficient h becomes smaller, and as the flow passage sectional area S becomes smaller, the heat transfer coefficient h becomes larger. Therefore, from the viewpoint of cooling ability, a smaller flow passage sectional area S is preferable.

In a case where the plurality of (four) reactors Lr disposed in a line are cooled in the same conditions, when the flow passage sectional area S of the linear flow passage is Sa as shown in FIG. 5, the flow passage sectional area S of the parallel flow passage becomes (4Sa), and the flow passage sectional area S of the turning flow passage becomes (Sa/2). Therefore, the heat transfer coefficient h obtained from the aforementioned expression (4) decreases in the order of the turning flow passage, the linear flow passage, and the parallel flow passage. Therefore, cooling ability of the turning flow passage is rated as excellent as shown by a double circle mark in FIG. 5, cooling ability of the linear flow passage is rated as good as shown by a circle mark in FIG. 5, and cooling ability of the parallel flow passage is rated as poor as shown by a cross mark in FIG. 5.

Further, a pressure loss ΔP in the cooling medium flow passage is expressed by the following expression (5).

$$\Delta P \propto v^2 \times L \tag{5}$$

That is, the pressure loss ΔP is proportional to the square of the flow velocity v, and also proportional to a flow passage length L. Since the flow velocity v is expressed by the foregoing expression (2), the pressure loss ΔP is expressed by the following expression (6).

$$\Delta P \propto (1/S)^2 \times L \tag{6}$$

That is, as the flow passage sectional area S becomes larger, the pressure loss ΔP becomes smaller, and as the flow passage sectional area S becomes smaller, the pressure loss ΔP becomes larger. Also, as the flow passage length L becomes larger, the pressure loss ΔP becomes larger.

A large pressure loss ΔP in the cooling medium flow passage means that a large amount of energy is consumed in order to cause the cooling medium to flow, and indicates that efficiency of energy utilization is low. Hence, from the viewpoint of cooling efficiency, it is preferable to decrease pressure loss in the cooling medium flow passage as much as possible.

As shown in FIG. 5, when the flow passage sectional area S of the linear flow passage is Sa, the flow passage sectional areas S of the parallel flow passage and the turning flow passage are (4Sa) and (Sa/2), respectively. When the flow passage length L of the linear flow passage is La, the flow passage lengths L of the parallel flow passage and the turning flow passage are (La/4) and (2La), respectively. Therefore, the pressure loss ΔP obtained from the foregoing expression (6) increases in the order of the parallel flow passage, the linear flow passage, and the turning flow passage. Thus, the cooling efficiency of the parallel flow passage is rated as excellent as shown by a double circle mark in FIG. 5, cooling efficiency of the linear flow passage is rated as good as shown by a circle mark in FIG. 5, and cooling efficiency of the turning flow passage is rated as poor as shown by a cross mark in FIG. 5.

Although the turning flow passage has the largest heat transfer coefficient h and thus has the highest cooling ability, its pressure loss ΔP is large. Therefore, cooling efficiency is poor. Although the parallel flow passage has the smallest pressure loss ΔP and thus has the highest cooling efficiency, its heat transfer coefficient h is small and thus the cooling ability is poor. In contrast, in the linear flow passage, both the heat transfer coefficient h and the pressure loss ΔP are good and both cooling ability and cooling efficiency are thus good. Since it is possible to achieve improvements of both cooling efficiency and cooling ability, the linear flow passage is the optimum cooling medium flow passage among the three kinds of the cooling medium flow passages. Therefore, for the above-mentioned reason, the linear flow passage is used as the cooling medium flow passage 193 in the embodiment.

Further, as shown in FIG. 4A, the cooling medium flow passage 193 is provided with flat flow passage portions 197 at positions each of which corresponds to a gap between the adjacent reactors Lr. The flat flow passage portions 197 are flat surfaces without cooling fins 196 on the inner surface 192*is* on the reverse side of the reactor cooling surface 192*os*. When a case is considered where the cooling medium flow passage has no flat flow passage portion 197 and is provided with continuous and long cooling fins, temperature boundary layers may be formed near the wall surfaces of the cooling medium flow passage. In the temperature boundary layers, flow velocity is decreased and temperature is thus increased towards the wall surfaces. In areas in the cooling medium flow passage where the temperature boundary layers are formed, the heat transfer coefficient is decreased, and cooling performance may thus be deteriorated. In contrast, the flat flow passage portions 197 have an effect of increasing turbulence in the cooling medium flowing from the upstream side along the upstream cooling fins 196. As a result, it is possible to restrain the temperature boundary layers from being formed, and it is thus possible to restrain a decrease in heat transfer coefficient due to the temperature boundary layers, thereby preventing deterioration of cooling performance. It is also possible to restrain influence of heat losses in the upstream side reactors Lr on cooling of the downstream side reactors Lr.

Further, when the flat plate portion 192 provided with the cooling fins 196 is formed by casting, the flat flow passage portions 197 has a further advantage. When casting is performed, it is required to have large tolerance for distal ends of the cooling fins 196 because there is a problem that the distal end sides of the cooling fins 196 are easily deformed when released from mold. However, when the tolerance is large, gaps between the distal ends of the cooling fins 196 and the wall surfaces of the cooling medium flow passage 193 become large, and it becomes difficult to improve the cooling medium flow velocity. As a result, it may become difficult to improve cooling performance.

In contrast, when there is the flat flow passage portion 197 between the cooling fins 196 corresponding to the reactors Lr, it is possible to reduce the lengths of the cooling fins 196 in the longitudinal direction. Also, when the flat plate portion 192 including the cooling fins 196 is formed by casting, it is possible to provide extrusion pin seats in portions of the mold corresponding to the flat flow passage portions 197. Thus, it becomes possible to prevent deformation of the distal ends of the cooling fins 196 while being released from mold, and it is thus possible to reduce the tolerance of the distal ends of the cooling fins 196. Thus, it is possible to reduce gaps between the distal ends of the cooling fins 196 and the wall surfaces of the cooling medium flow passage 193, thereby improving flow velocity as well as the heat transfer coefficient of the cooling medium.

As explained so far, in the reactor unit 152 in the embodiment, the plurality of reactors Ix are disposed in a line on the reactor cooling surface 192*os* of the cooler 190. The cooler 190 has the cooling medium flow passage 193 that is in contact with the inner surface 192*is* of the reactor cooling surface 192*os*. The cooling medium flow passage 193 is a linear flow passage in which cooling medium flows linearly, and its flow direction WD is the same as the direction in which the plurality of reactors Lr are disposed in a line (direction of the line). Also, the inner surface 192*is* is provided with the cooling fins 196, the longitudinal direction of the cooling fins 196 extending along the flow direction WD. Thus, the reactor unit 152 is able to achieve both a reduction of the pressure loss ΔP and improvement of heat transfer coefficient h in the cooling medium flow passage 193, thereby ensuring cooling performance and reducing the height of the reactor unit 152.

Further, by providing the flat flow passage portions 197 in the cooling medium flow passage 193, it is possible to prevent a reduction of a heat transfer coefficient caused by generation of the temperature boundary layers, thereby restraining deterioration of cooling performance. Among the plurality of reactors Lr disposed in a line, the downstream side reactors Lr in the cooling medium flow direction WD are restrained from being affected by heat of the upstream side reactors Lr (in other words, "heat interference" is restrained). The flat flow passage portions 197 may be omitted.

In the fuel cell vehicle 10 in the embodiment, it is possible to dispose the reactor unit 152 on top of the FC assembly 112 including the fuel cell 110, inside the front compartment 12 as shown in FIG. 2A and FIG. 2B. That is, it is possible to dispose the reactor unit 152 above the fuel cell 110.

Further, by disposing the reactor unit 152 such that the plurality of reactors Lr are disposed in the lower side and the cooler 190 is disposed in the upper side as shown in FIG. 3A and FIG. 3B, it is possible to dispose the HP inverter 157 for the fuel pump 122 and the WP inverter 158 for the cooling medium pump 142 on the outer surface 191*os* in an upper portion of the cooler 190. Thus, it is possible to cool the HP inverter 157 and the WP inverter 158 and to save space. As a result of this, a compact mounting structure as shown in FIG. 2A is realized inside the front compartment 12 that is restricted in the height direction.

The foregoing embodiment is explained using the reactor unit 152 as an example, the reactor unit 152 being used in the FC converter 151 of the fuel cell system 100 mounted in the fuel cell vehicle 10. However, the disclosure is not limited to this, and may be applied as a reactor unit used for a device including a plurality of reactors. In particular, this reactor unit has a high utility value as a reactor unit that is used when an arrangement space for a reactor unit is restricted in a height direction.

Also, the foregoing embodiment is explained in an example where the HP inverter 157 that is a drive circuit for the fuel pump 122, and the WP inverter 158 that is a drive circuit for the cooling medium pump 142 are disposed on top of the cooler 190 of the reactor unit 152. However, the disclosure is not limited to this, and, among the other components of the fuel cell system 100, components that are preferably cooled may be disposed on top of the cooler 190.

Further, the foregoing embodiment is explained using the reactor unit as an example, in which the plurality of reactors Lr are disposed in a line on the reactor cooling surface 192os, but the plurality of reactors Lr may be disposed in a plurality of lines. The number of reactors Lr in each line is not limited to four, and may be four or smaller, or four or larger.

Furthermore, in the foregoing embodiment, the flat flow passage portions 197 are disposed such that each flat flow passage portion is provided between the cooling fins 196 corresponding to the respective reactors Lr, thereby increasing turbulence in a flow of the cooling medium that flows from the upstream side along the upstream cooling fins 196. However, a structure for increasing turbulence in a cooling medium flow is not limited to the flat flow passage portion 197, and a curved surface flow passage portion, a low fin flow passage portion, or a small number fin flow passage portion may be used. The curved surface flow passage portion is a portion in which the inner surface 192*is* on the reverse side of the reactor cooling surface 192os is a curved surface. The low fin flow passage portion includes low cooling fins having a height lower than a height of the upstream cooling fins 196. The small number fin flow passage portion is a portion in which the number of the cooling fins 196 is small.

The disclosure is not limited to the foregoing embodiment and modifications, and is realized in various structures without departing from the scope of the intention. For example, technical features in the embodiment and modifications may be replaced or combined as appropriate in order to solve a portion of or all of the problems stated earlier or achieve a portion of or all of the foregoing effects. Unless the technical features are explained as essential herein, such technical features may be omitted as appropriate.

What is claimed is:

1. A fuel cell vehicle comprising:
   a fuel cell;
   a reactor unit including:
     a plurality of reactors, and
     a cooler configured such that a cooling medium flows in an inside of the cooler and the plurality of reactors are disposed on an outside of the cooler to cool the plurality of reactors, wherein
     the plurality of reactors are disposed in at least one line on a reactor cooling surface that is one of outer surfaces of the cooler,
     the cooler has a cooling medium flow passage that is in contact with an inner surface on a reverse side of the reactor cooling surface,
     the cooling medium flows linearly from an inlet portion to an outlet portion of the cooling medium flow passage,
     a direction in which the cooling medium flows inside the cooling medium flow passage is same as a direction in which the plurality of reactors are disposed in the at least one line,
     cooling fins are provided on the inner surface on the reverse side of the reactor cooling surface, and
     a longitudinal direction of each of the cooling fins is same as the direction in which the cooling medium flows inside the cooling medium flow passage; and
   a fuel cell converter that converts output voltage of the fuel cell, wherein the fuel cell is disposed in a front compartment of the fuel cell vehicle, and the reactor unit included in the fuel cell converter is disposed above the fuel cell such that the plurality of reactors are disposed in a lower side and the cooler is disposed in an upper side.

2. The fuel cell vehicle according to claim 1, wherein a drive circuit unit configured to drive a cooling medium pump that supplies, to the fuel cell, a fuel cell cooling medium for cooling the fuel cell, and a drive circuit unit configured to drive a fuel pump that supplies fuel gas to the fuel cell are disposed on an outer surface of an upper side of the cooler.

3. The fuel cell vehicle according to claim 1, wherein the cooling medium flow passage includes a member selected from the group consisting of:
   i) a flat flow passage portion in which no cooling fin is provided and the inner surface is a flat surface,
   ii) a curved surface flow passage portion in which no cooling fin is provided and the inner surface is a curved surface,
   iii) a low fin flow passage portion including low cooling fins having a height lower than a height of the cooling fins,
   iv) a small number fin flow passage portion in which the number of the cooling fins is smaller than the number of the cooling fins at a position corresponding to each of the plurality of reactors, and
   the member is provided at a position corresponding to a gap between the reactors adjacent to each other in the direction in which the plurality of reactors are disposed in the at least one line.

* * * * *